US009166535B2

(12) United States Patent
Hong et al.

(10) Patent No.: US 9,166,535 B2

(45) Date of Patent: Oct. 20, 2015

(54) CIRCUIT OF OPERATIONAL AMPLIFIER

(71) Applicant: Novatek Microelectronics Corp., Hsinchu (TW)

(72) Inventors: Kuo-Che Hong, Hsinchu (TW); Ji-Ting Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 75 days.

(21) Appl. No.: 14/053,616

(22) Filed: Oct. 15, 2013

(65) Prior Publication Data

US 2014/0253240 A1 Sep. 11, 2014

(30) Foreign Application Priority Data

Mar. 5, 2013 (TW) ............................ 102107730 A

(51) Int. Cl.
*H03F 3/45* (2006.01)
*H03F 3/16* (2006.01)

(52) U.S. Cl.
CPC ................ *H03F 3/16* (2013.01); *H03F 3/4521* (2013.01)

(58) Field of Classification Search
USPC ................................. 330/255, 253, 259, 260
IPC .......................................................... H03F 3/45
See application file for complete search history.

(56) References Cited

U.S. PATENT DOCUMENTS

| | | | | |
|---|---|---|---|---|
| 5,307,024 | A * | 4/1994 | Metz et al. | 330/259 |
| 6,384,683 | B1 | 5/2002 | Lin | |
| 6,781,805 | B1 * | 8/2004 | Urakawa | 361/56 |
| 6,914,485 | B1 * | 7/2005 | Carroll | 330/258 |
| 2006/0017504 | A1 * | 1/2006 | Deval et al. | 330/253 |
| 2008/0186102 | A1 * | 8/2008 | Gerstenhaber et al. | 330/298 |
| 2008/0252375 | A1 * | 10/2008 | Tso et al. | 330/253 |
| 2009/0237163 | A1 * | 9/2009 | Bhattacharya et al. | 330/253 |
| 2012/0133632 | A1 * | 5/2012 | Hsu | 345/211 |

OTHER PUBLICATIONS

"Office Action of Taiwan Counterpart Application," issued on Jul. 23, 2015, pp. 1-5, in which the listed references were cited.

* cited by examiner

*Primary Examiner* — Patricia T Nguyen

(74) *Attorney, Agent, or Firm* — Jianq Chyun IP Office

(57) ABSTRACT

A circuit of an operational amplifier includes an operational main circuit, a plurality of current sources, and at least one clamp circuit. The current sources are configured to connect the operational main circuit to a high voltage source or a ground voltage source. The clamp circuit is connected between the operational main circuit and at least one of the current sources. Here, a transistor device connected to the clamp circuit has a crossing-voltage endurance level which is lower than a preset crossing-voltage endurance level of the operational main circuit.

12 Claims, 11 Drawing Sheets

CIRCUIT OF OPERATIONAL AMPLIFIER

CROSS-REFERENCE TO RELATED APPLICATION

This application claims the priority benefit of Taiwan application serial no. 102107730, filed on Mar. 5, 2013. The entirety of the above-mentioned patent application is hereby incorporated by reference herein and made a part of this specification.

BACKGROUND OF THE INVENTION

1. Technical Field

The disclosure is directed to a circuit of an operational amplifier. More particularly, the disclosure is directed to a circuit of an operational amplifier which is capable of reducing an area occupied by devices and may be stably and instantly operated at a preset crossing voltage.

2. Description of Related Art

In order to allow a normal operational amplifier to be operated on the condition that a preset crossing voltage is given, the entire circuitry may be designed to have transistors having the same crossing-voltage endurance level. The transistors having the high crossing-voltage endurance levels often occupy significant area; accordingly, the entire operational amplifier also occupies large area, and the resultant manufacturing costs are relatively high.

A conventional operational amplifier during operation is connected between a high voltage source VDD and a ground voltage source VSS. To ensure that each transistor in use may endure the crossing voltage Vds and that the device properties remain unchanged during the operation of each transistor, all of the transistors use the same kind of devices (i.e., a transistor device A) having a preset bias endurance level. Here, the bias endurance level of the transistor device A is restricted to X volts. Note that the value of X is not necessarily a fixed voltage value; instead, the value of X serves to indicate the devices having the high preset crossing-voltage endurance level from the other devices.

According to the operational principle of the operational amplifier, the crossing voltage of each transistor may not be the same while the operational amplifier is in operation, and not all of the transistors endure the voltage crossing over the high voltage source VDD and the ground voltage source VSS. In this case, if the transistor device A is applied to design the transistors, the excessive area occupied by the transistors may be considered as a waste.

Accordingly, how to reduce the area in use of the operational amplifier and simultaneously guarantee the stable and constant operation of the operational amplifier having the preset crossing-voltage level are taken into account in the field pertinent to circuit design.

SUMMARY OF THE DISCLOSURE

The disclosure is directed to a circuit of an operational amplifier. The circuit described herein is designed to occupy a relatively small area, and thereby manufacturing costs of the circuit are lowered down.

In an exemplary embodiment of the disclosure, a circuit of an operational amplifier that includes an operational main circuit, a plurality of current sources, and at least one clamp circuit is provided. The current sources are configured to connect the operational main circuit to a high voltage source or a ground voltage source. The clamp circuit is connected between the operational main circuit and at least one of the current sources. Here, a transistor device connected to the clamp circuit has a crossing-voltage endurance level which is lower than a preset crossing-voltage endurance level of the operational main circuit.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

In the disclosure, a circuitry design of an operational amplifier is provided. The design allows the operational amplifier to be operated as usual, while an area occupied by the circuit of the operational amplifier may be effectively reduced.

Several exemplary embodiments are described hereinafter to elaborate the invention. However, the disclosure is not limited to the exemplary embodiments provided herein, and proper combination or modification of these embodiments may be permissive.

Figure 1A:
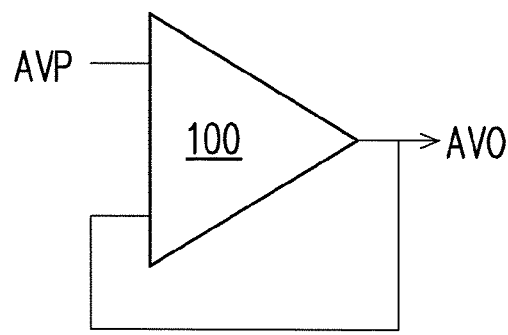
FIG. 1A is a schematic block diagram illustrating a basic circuit of an operational amplifier.

FIG. 1A is a schematic block diagram illustrating a basic circuit of an operational amplifier. With reference to FIG. 1A, the operational amplifier 100 includes two input terminals and one output terminal. One of the two input terminals receives an external input as a voltage input signal AVP. The other input terminal receives a feedback signal of an output signal AVO. The operational amplifier 100 is operated between a high voltage source VDD and a ground voltage source VSS.

Figure 1B:
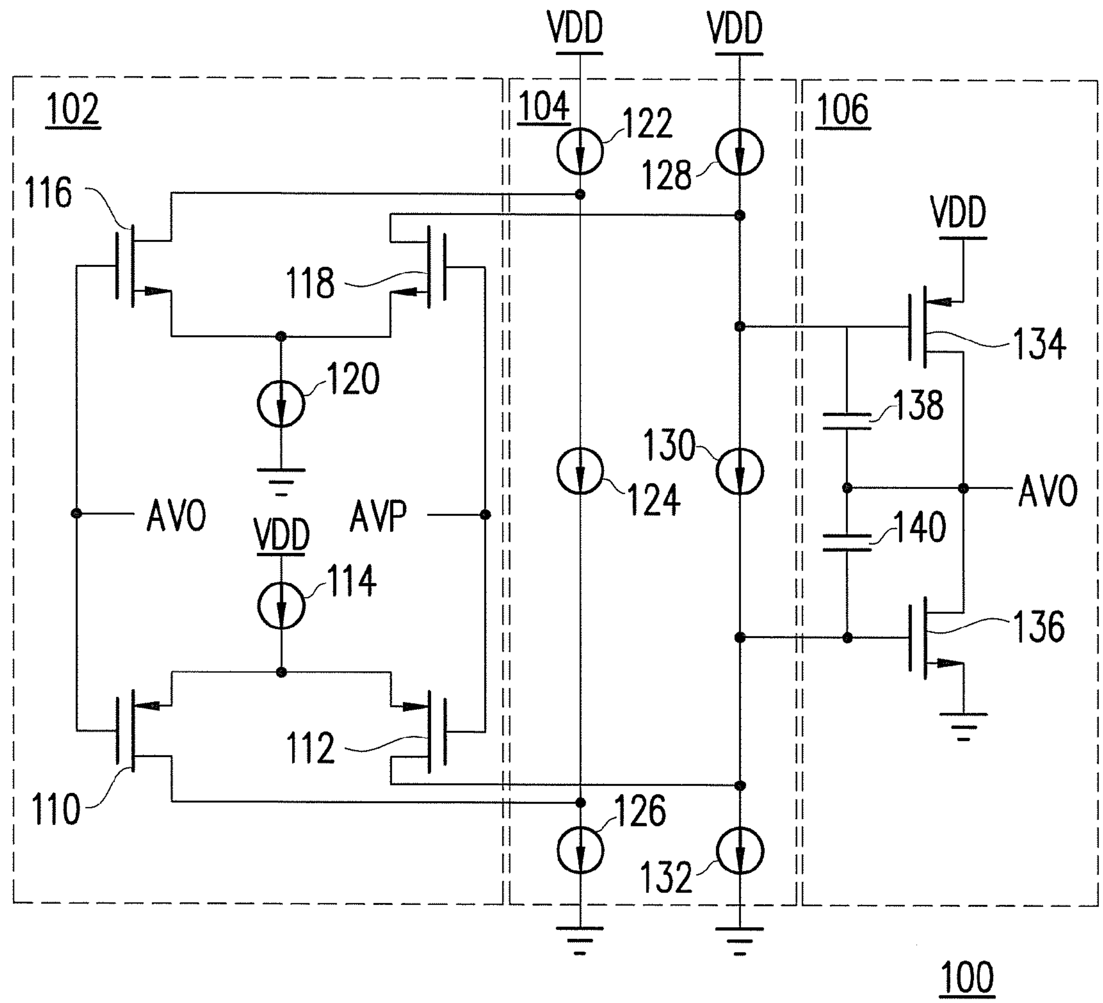
FIG. 1B is a schematic diagram illustrating a detailed circuit of an operational amplifier according to an exemplary embodiment of the disclosure.

FIG. 1B is a schematic diagram illustrating a detailed circuit of an operational amplifier according to an exemplary embodiment of the disclosure. With reference to FIG. 1B, the detailed circuit of the operational amplifier 100 shown in FIG. 1A may be categorized into an operational main circuit and a plurality of current sources 114, 120, 122, 126, 128, and 132. The current sources are configured to connect the operational main circuit to the high voltage source VDD or the ground voltage source VSS. Here, parts of transistor devices constituting the current sources 114, 120, 122, 126, 128, and 132 may include devices having a relatively low crossing-voltage endurance level. Besides, parts of transistors 110, 112, 116, and 118 of the operational main circuit may also include devices having a relatively low crossing-voltage endurance level.

The transistor device having a relatively low crossing-voltage endurance level is labeled as a transistor device B. The crossing-voltage endurance level of the transistor device B is restricted to Y volts. The value of Y is smaller than the value of X, so as to distinguish the devices having the relatively low crossing-voltage endurance level from the other devices.

The operational main circuit normally includes a voltage-to-current circuit 102, a current operational circuit 104, and an operational amplifying circuit 106. The voltage-to-current circuit 102 has a first input terminal and a second input terminal corresponding to the input terminals and the output terminal of the operational amplifier 100 depicted in FIG. 1A. The first input terminal receives an external input of a voltage input signal AVP, and the second input terminal receives a feedback signal from the output terminal. The current operational circuit 104 is connected to the voltage-to-current circuit 102. The operational amplifying circuit 106 is connected to current operational circuit 104 and outputs an amplified voltage output signal AVO. The voltage output signal AVO is fed back to the second input terminal.

The voltage-to-current circuit 102 may include a plurality of metal oxide semiconductor (MOS) transistors 110, 112, 116, and 118 with different conductive types. For instance, the pair of transistors 110 and 112 is composed of p-type MOS (PMOS) transistors, and the sources of the PMOS transistors are connected to the high voltage source VDD through the current source 114. The other pair of transistors 116 and 118 is composed of n-type MOS (NMOS) transistors, and the sources of the NMOS transistors are connected to the ground voltage source VSS through the current source 120. The gates of the transistors 112 and 118 are the first input terminals which receive the voltage input signal AVP. The gates of the transistors 114 and 116 are the second input terminals which receive the feedback signal of the voltage output signal AVO.

It should be mentioned that the MOS transistor normally has one gate, one source, and one drain. The structure of the source is the same as the structure of the drain, and thus the source and the drain may be exchanged when they are actually applied. In the description, the wordings "the source" and "the drain" refer to two connection electrodes which serve to identify different connection electrodes of the device and may be exchangeable.

The current operational circuit 104 has two current paths, for instance, and one of the current paths is constituted by three serially-connected current sources 122, 124, and 126, for instance. The current sources 122 and 126 are respectively connected to the high voltage source VDD and the ground voltage source VSS. The other current path is constituted by three serially-connected current sources 128, 130, and 132, for instance, and the current sources 128 and 132 are respectively connected to the high voltage source VDD and the ground voltage source VSS.

In most cases, the current sources 114, 120, 122, and 126 and the transistors 110, 112, 116, and 118 in the operational amplifier are not required to have the high crossing-voltage endurance level over the high voltage source VDD and the ground voltage source VSS; therefore, the current sources 114, 120, 122, and 126 and the transistors 110, 112, 116, and 118 may be constituted by devices having the relatively low crossing-voltage endurance level, and the amplified output signal is not affected thereby.

The operational amplifying circuit 106 usually includes two serially-connected transistors 134 and 136 and two serially-connected capacitors 138 and 140. Here, two terminals of the operational amplifying circuit 106 are connected to two terminals of the current source 130, and the terminal at middle is an output terminal that outputs the voltage output signal AVO.

Figure 2:
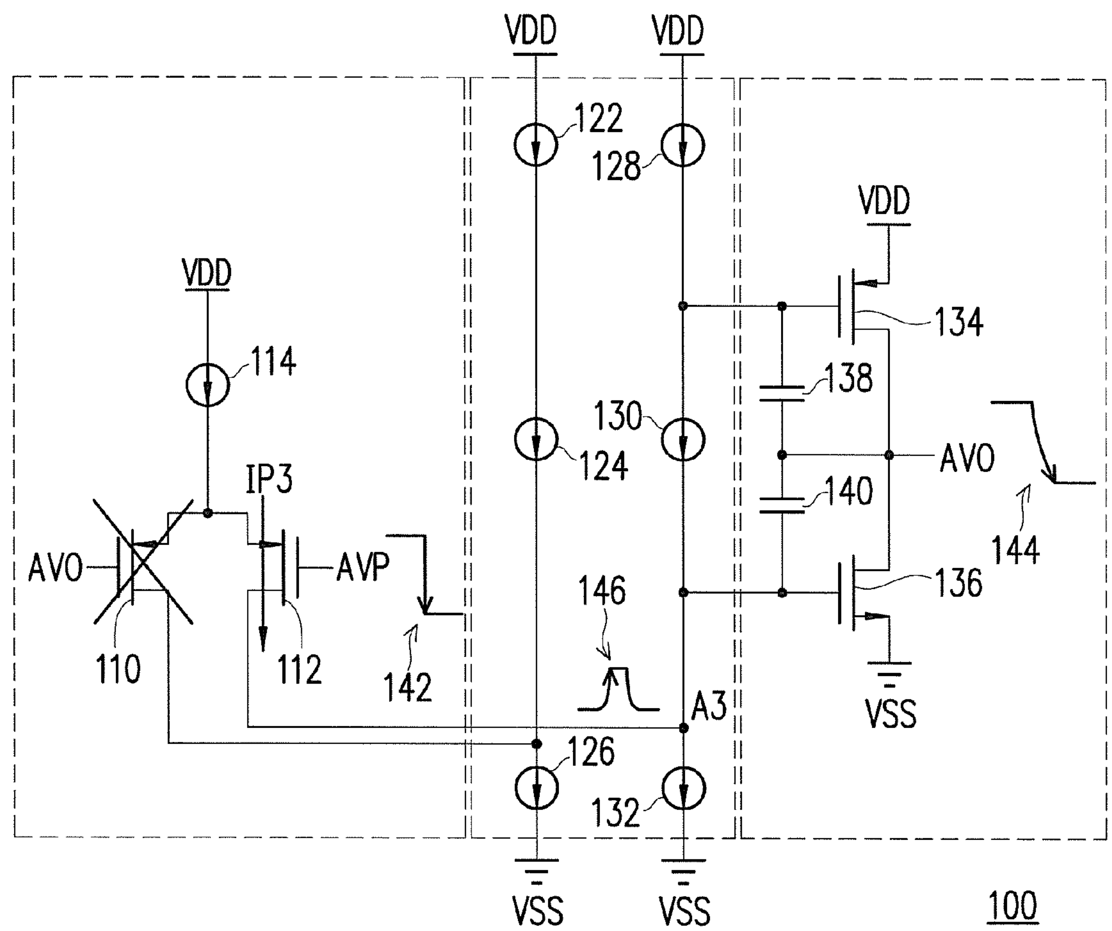
FIG. 2 is a schematic diagram illustrating an operational mechanism of transistors 110 and 112 according to an exemplary embodiment of the disclosure.

The operational mechanism of the transistors is described below. FIG. 2 is a schematic diagram illustrating an operational mechanism of transistors 110 and 112 according to an exemplary embodiment of the disclosure. With reference to FIG. 2 as well as FIG. 1B that shows the pair of p-type transistors 110 and 112, when the voltage input signal AVP represents the waveform of the signal 142 and is changed to have the low voltage level from the high voltage level in a transient manner, the p-type transistor 112 is switched on; at this instant time, the gate of the transistor 110 instantly still has the high voltage level and is thus in an OFF state. Since the transistor 112 is switched on, a node A3 connected to the current source 132 is charged by the current from the current source 114 through the transistor 112. Due to the transient current that charges the node A3, the voltage of the node A3 is significantly raised, such that the signal 144 at the output terminal of the operational amplifier 100 reaches to a discharged state.

Nonetheless, during the continual charging and discharging process over a long period of time, the voltage of the node A3 is drastically raised or reduced; in response thereto, the power supply of the operational amplifier extracts a significant amount of transient current, which easily results in damages to the power supply or shortens the life span of the power supply. If the operational amplifier is designed to have the devices with different crossing-voltage endurance levels, the device abilities are apt to be impaired.

Figure 3:
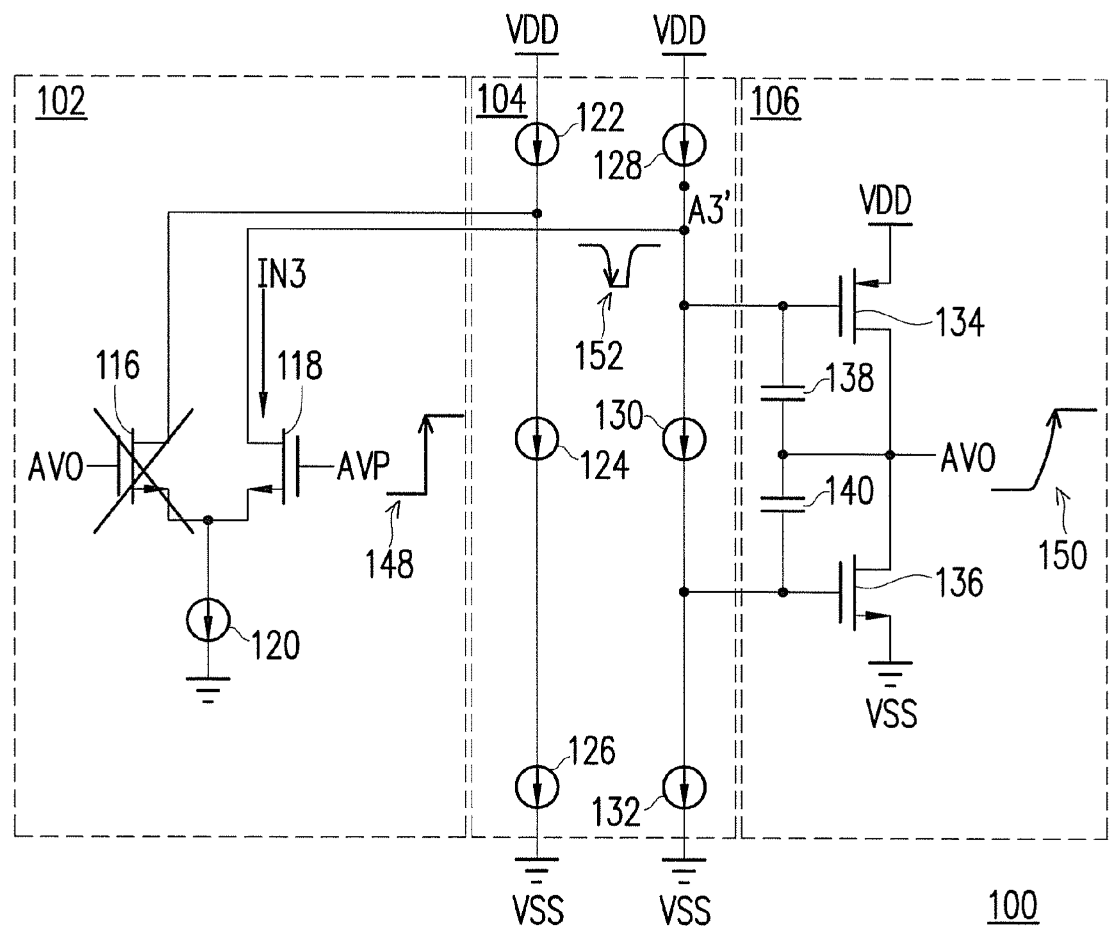
FIG. 3 is a schematic diagram illustrating an operational mechanism of transistors 116 and 118 according to an exemplary embodiment of the disclosure.

FIG. 3 is a schematic diagram illustrating an operational mechanism of transistors 116 and 118 according to an exemplary embodiment of the disclosure. With reference to FIG. 3, the transistors 116 and 118 are NMOS transistors. The gate of the transistor 116 is the second input terminal which receives the feedback signal of the voltage output signal AVO. The gate of the transistor 118 is the first input terminal which receives the voltage input signal AVP. For instance, the voltage input signal AVP represents the waveform of the signal 148 and is changed to have the high voltage level from the low voltage level in a transient manner. The n-type transistor 118 is switched on; at this instant time, the gate of the transistor 116 instantly still has the low voltage level and is thus in an OFF state. Since the transistor 118 is switched on, a node A3' connected to a current source is discharged by the current from the current source 120 through the transistor 118, like the front edge of the signal 152; thereby, the output terminal of the operational amplifier 100 is charged, like the exemplary signal 150.

Similarly, during the continual charging and discharging process over a long period of time, the voltage of the node A3' is drastically raised or reduced; in response thereto, the power supply of the operational amplifier extracts a significant amount of transient current, which easily results in damages to the power supply or shortens the life span of the power supply. If the operational amplifier is designed to have the devices with different crossing-voltage endurance levels, the device abilities are apt to be impaired.

To protect parts of the devices having the relatively low crossing-voltage endurance level from being damaged, a clamp circuit is employed in an exemplary embodiment of the invention, so as to restrict the response range of the transient voltage and allow the use of the devices (e.g., the transistor device B) having the relatively low crossing-voltage endurance level.

The number and the location of the clamp circuit may be determined according to actual demands. Generally, there is at least one clamp circuit connected between the operational main circuit and at least one of the current sources. The current sources connected to the clamp circuit are also connected to the high voltage source VDD or the ground voltage source VSS.

Note that the transistor device connected to the clamp circuit has a crossing-voltage endurance level, and the crossing-voltage endurance level of the transistor device may be lower than a preset crossing-voltage endurance level of the operational main circuit.

Figure 4:
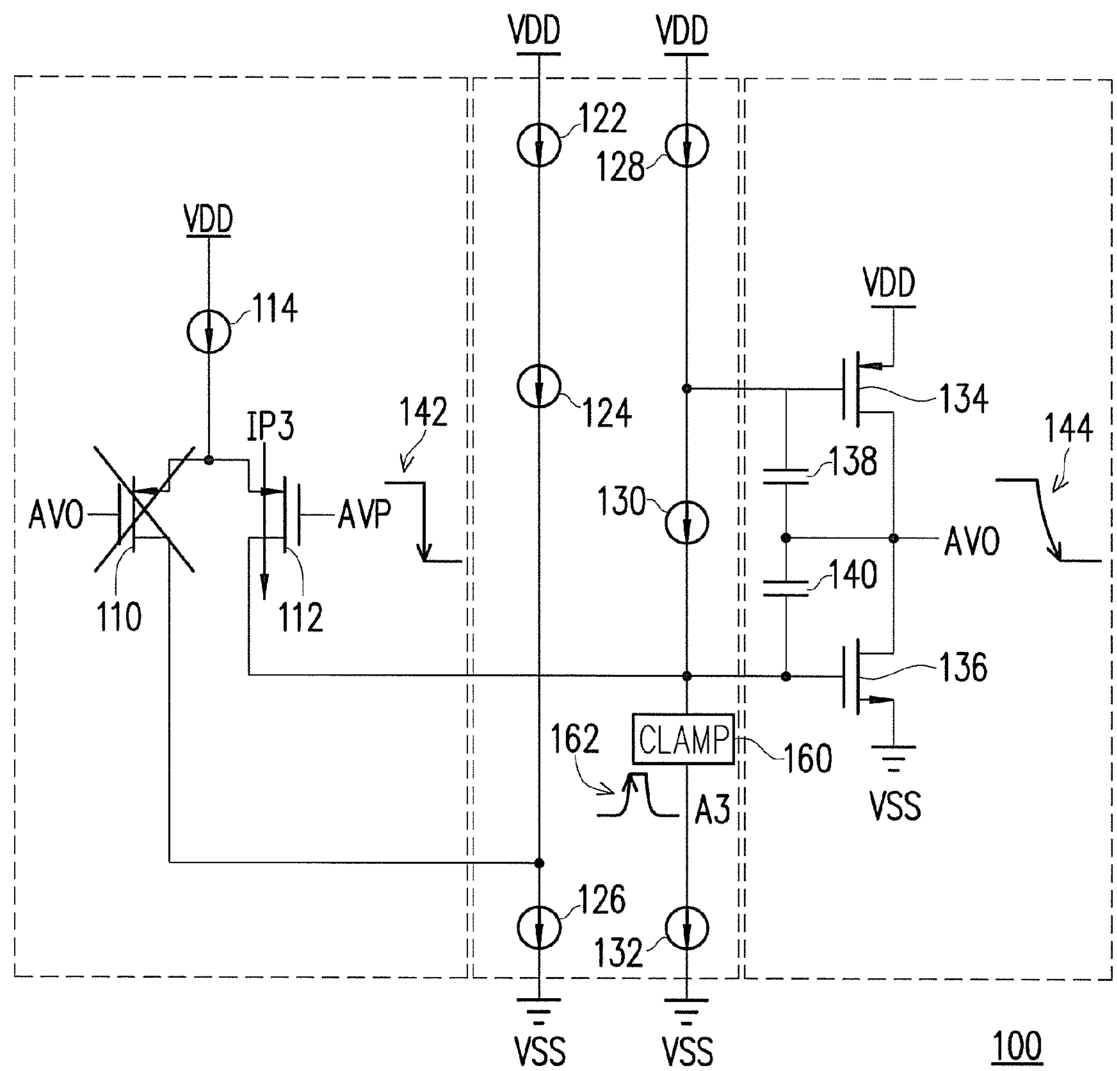
FIG. 4 is a schematic diagram illustrating a circuit of an operational amplifier according to an exemplary embodiment of the disclosure, and the circuit of the operational amplifier has a clamp circuit.

Several exemplary embodiments showing different circuitry designs are provided hereinafter to elaborate the invention. FIG. 4 is a schematic diagram illustrating a circuit of an operational amplifier according to an exemplary embodiment of the disclosure, and the circuit of the operational amplifier has a clamp circuit. As shown in FIG. 4 and based on the circuitry shown in FIG. 2, the clamp circuit 160 may be configured between the transistor 112 and the current source 132. Owing to the clamp circuit 160, the voltage variation range of the signal 162 at the node A3 is small, and thus one or both of the current source 132 and the transistor 112 may be formed by the device having the low crossing-voltage endurance level.

As to the circuitry connection, the p-type transistor 112 has a gate, a source, and a drain, and the gate serves as the first input terminal that receives the voltage input signal AVP. The source is connected to a first terminal of the current source 114 among the current sources, and a second terminal of the current source 114 is connected to the high voltage source VDD.

The other p-type transistor 110 has a gate, a source, and a drain, and the gate serves as the second input terminal that receives a feedback signal of the voltage output signal AVO. The source of the p-type transistor 110 is connected to the source of the transistor 112 and one terminal of the current source 114.

In the present exemplary embodiment, the clamp circuit 160 is connected to the drain of the transistor 112. In general, one or both of the drains of the transistors 110 and 112 may be connected to the clamp circuit 160. The clamp circuit 160 will be further exemplified in the following embodiments.

Figure 5:
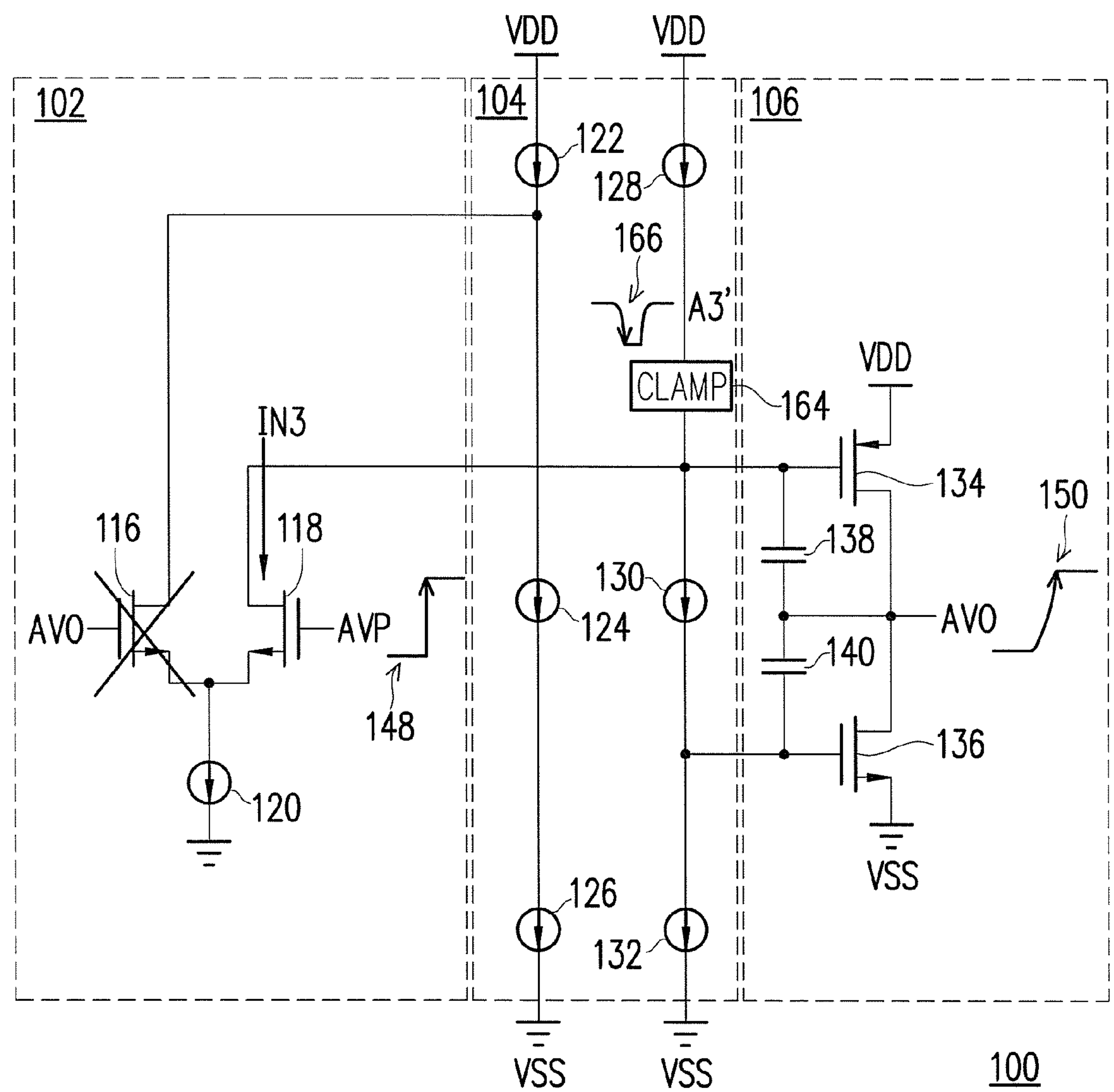
FIG. 5 is a schematic diagram illustrating a circuit of an operational amplifier according to an exemplary embodiment of the disclosure, and the circuit of the operational amplifier has a clamp circuit.

Similarly, the clamp circuit may also be added to the circuit shown in FIG. 3. FIG. 5 is a schematic diagram illustrating a circuit of an operational amplifier according to an exemplary embodiment of the disclosure, and the circuit of the operational amplifier has a clamp circuit. With reference to FIG. 5, the clamp circuit 164 is configured at the node A3' and connected between the n-type transistor 118 and the current source 128, for instance. Owing to the clamp circuit 164, the voltage variation range of the signal 166 at the node A3' is reduced, and thus one or both of the current source 128 and the transistor 118 correspondingly connected to the clamp circuit 164 may be formed by the device having the low crossing-voltage endurance level.

As to the circuitry connection, the n-type transistor 118 has a gate, a source, and a drain, and the gate serves as the first input terminal that receives the voltage input signal AVP. The source is connected to one terminal of the current source 128 among the current sources, and the other terminal of the current source 128 is connected to the ground voltage source VSS.

The other n-type transistor 116 has a gate, a source, and a drain, and the gate serves as the second input terminal that receives a feedback signal of the voltage output signal AVO. The source of the n-type transistor 116 is connected to the source of the transistor 118 and one terminal of the current source 128.

In the present exemplary embodiment, the clamp circuit 166 is connected to the drain of the transistor 118. In general, one or both of the drains of the transistors 116 and 118 may be connected to the clamp circuit 166.

The clamp circuit may be designed to have the well-known structure, e.g., the clamp circuit may include the simple MOS transistor devices and may clamp the voltage through controlling the gate voltage.

Figure 6:
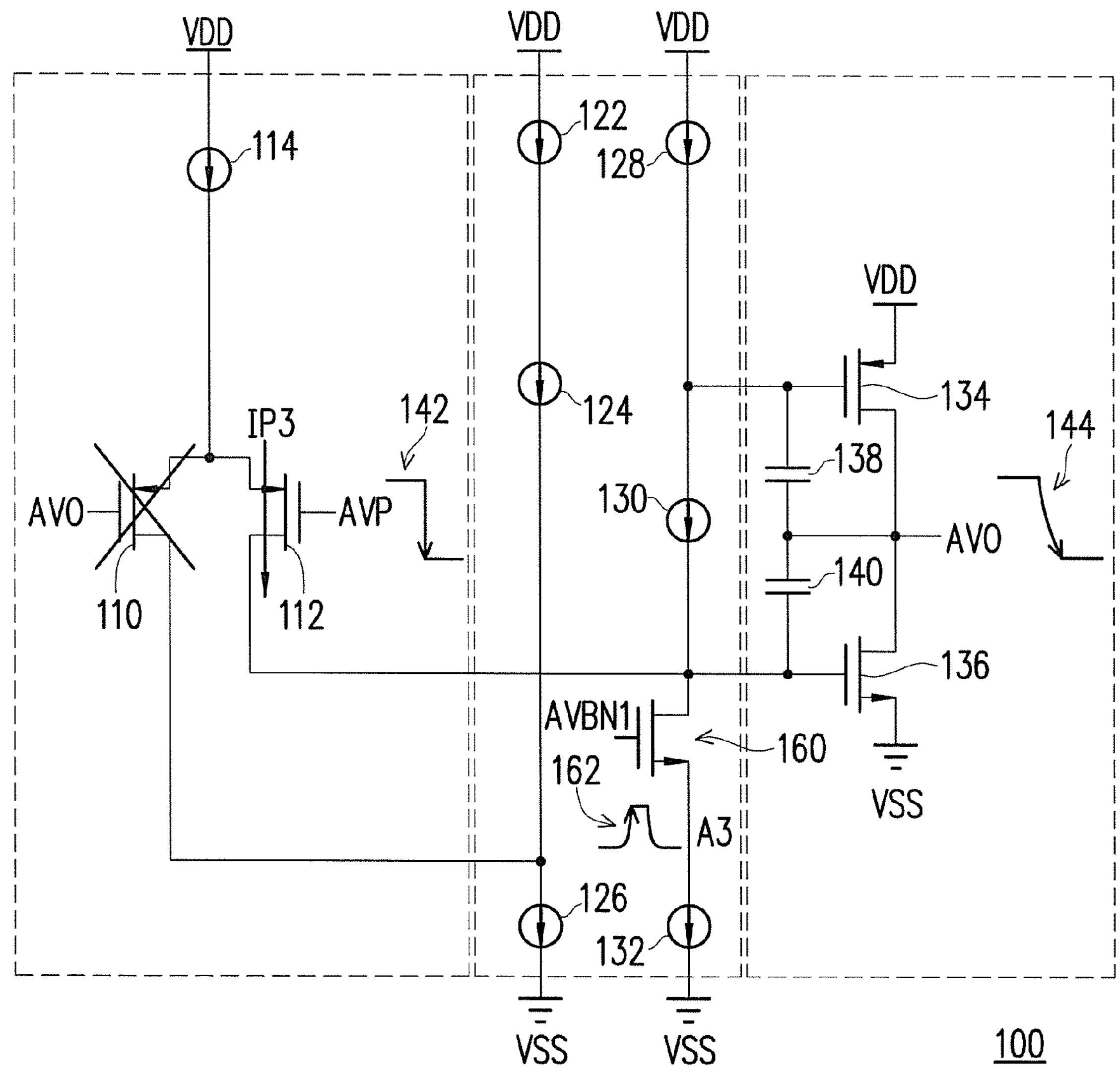
FIG. 6 is a schematic diagram illustrating a circuit of an operational amplifier according to an exemplary embodiment of the disclosure, and the circuit of the operational amplifier has a clamp circuit.

FIG. 6 is a schematic diagram illustrating a circuit of an operational amplifier according to an exemplary embodiment of the disclosure, and the circuit of the operational amplifier has a clamp circuit. The circuit shown in FIG. 6 corresponds to the circuit depicted in FIG. 4, and the clamp circuit 160 herein refers to an MOS transistor device. The clamp circuit 160 is controlled by a control voltage AVBN1, i.e., the gate of the transistor is controlled, so as to clamp the voltage. The control voltage AVBN1 may be supplied by an individual external source or provided by an internal control circuit according to the voltage input signal AVP, which will be described below.

Figure 7:
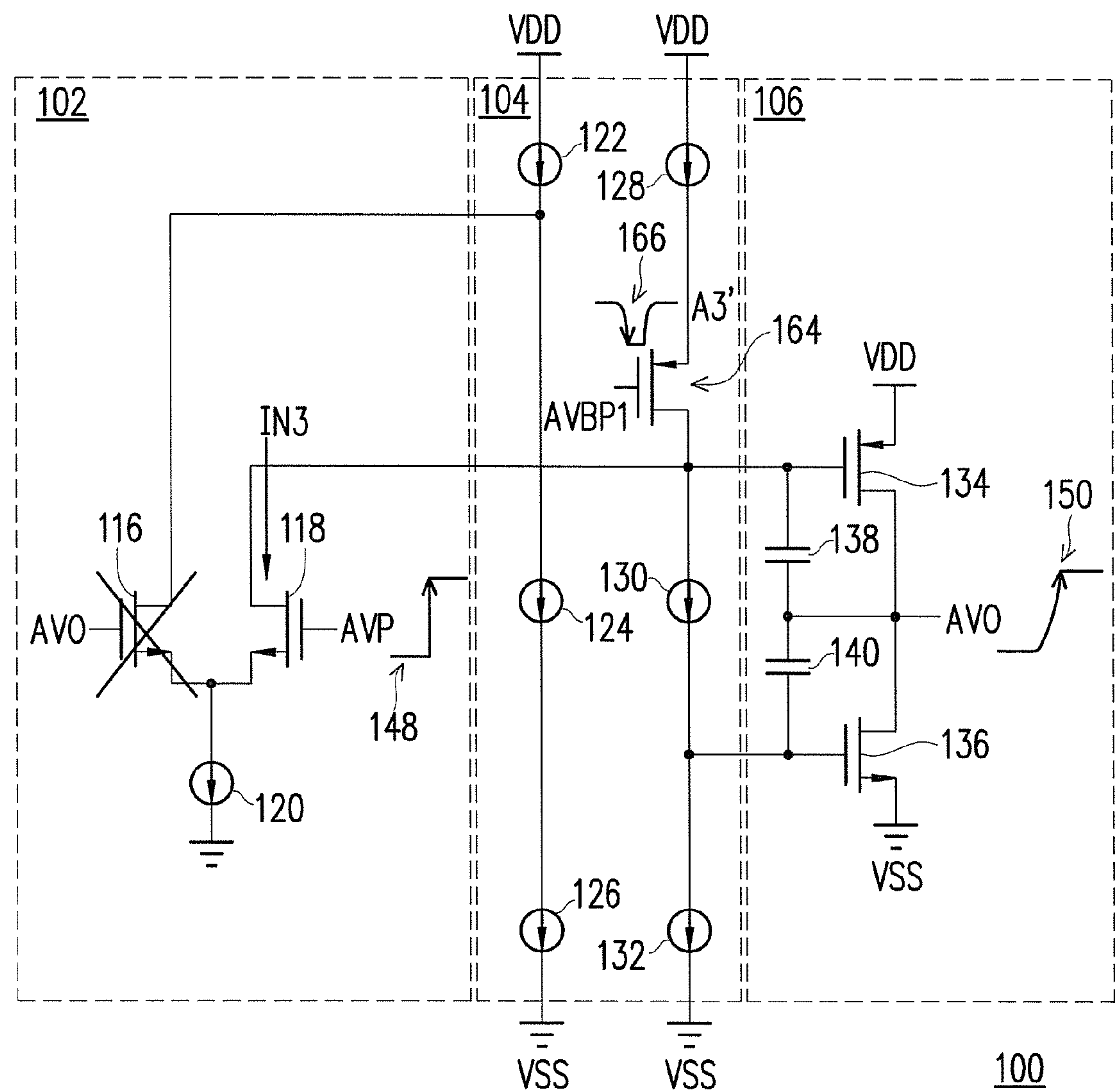
FIG. 7 is a schematic diagram illustrating a circuit of an operational amplifier according to an exemplary embodiment of the disclosure, and the circuit of the operational amplifier has a clamp circuit.

FIG. 7 is a schematic diagram illustrating a circuit of an operational amplifier according to an exemplary embodiment of the disclosure, and the circuit of the operational amplifier has a clamp circuit. The circuit shown in FIG. 7 corresponds to the circuit depicted in FIG. 5, and the clamp circuit 164 herein refers to an MOS transistor device. The clamp circuit 164 is controlled by a control voltage AVBP1, i.e., the gate of the transistor is controlled, so as to clamp the voltage. The control voltage AVBP1 may be supplied by an individual external source or provided by an internal voltage control circuit according to the voltage input signal AVP, which will be described below.

Figure 8:
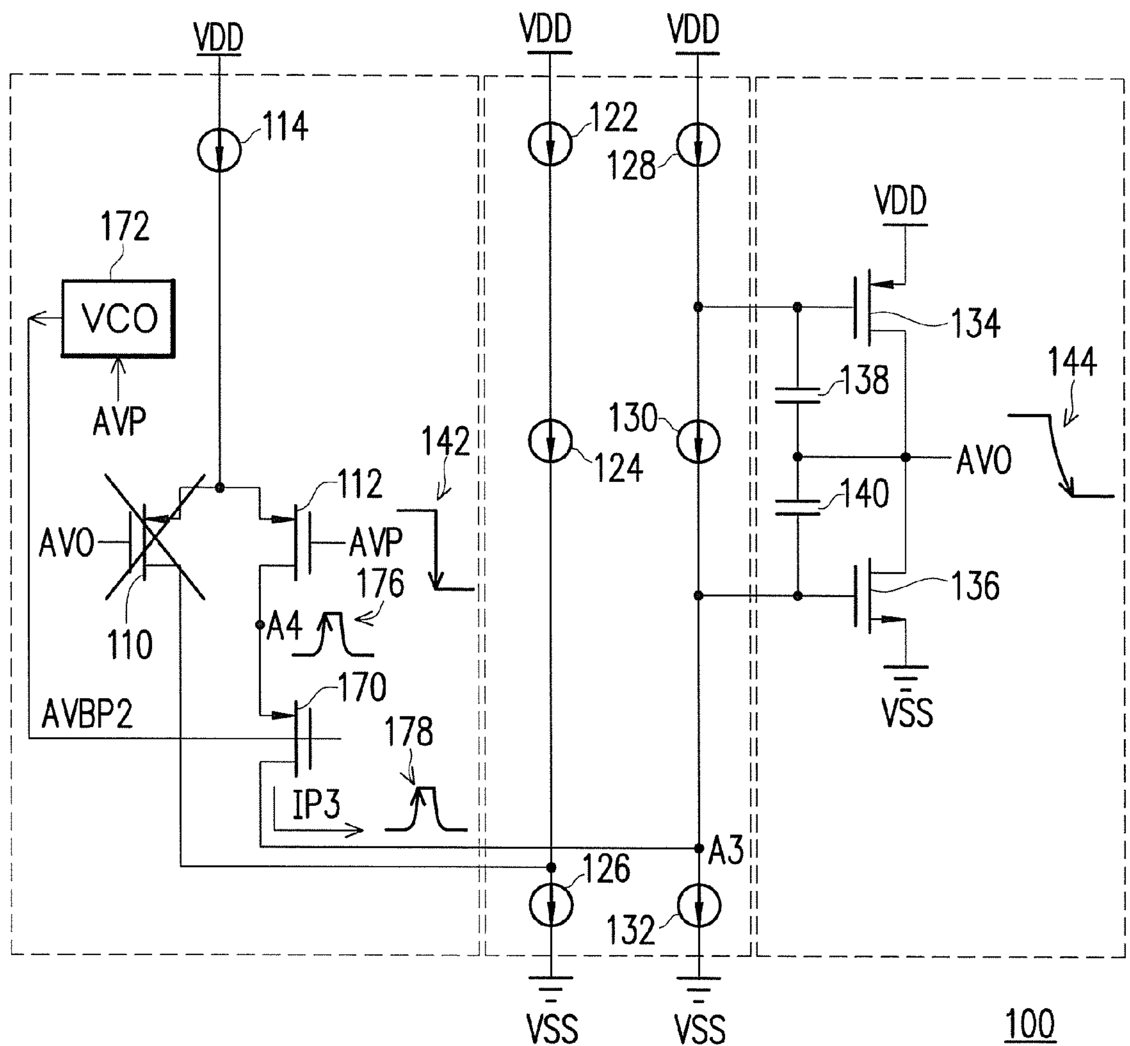
FIG. 8 is a schematic diagram illustrating a circuit of an operational amplifier according to an exemplary embodiment of the disclosure, and the circuit of the operational amplifier has a clamp circuit.

FIG. 8 is a schematic diagram illustrating a circuit of an operational amplifier according to an exemplary embodiment of the disclosure, and the circuit of the operational amplifier has a clamp circuit. The circuit shown in FIG. 8 corresponds to the circuit depicted in FIG. 4, and the clamp circuit 160 herein includes an MOS transistor 170 and a voltage control (VCO) circuit 172. The gate of the MOS transistor 170 is controlled by the control voltage AVBP2 output from the VCO circuit 172, and the VCO circuit 172 receives the voltage input signal AVP to output the control voltage AVBP2.

The MOS transistor 170 is connected between the transistor 112 and the current source 132. The node A3 is the connection point between the transistor 112 and the transistor 170, and thus the signal 176 at the node A3 is reduced; however, the signal 178 at the node A4 is caused by the current IP3 from the current source 114 through the transistor 170 and is accordingly arriving to a predetermined varying level, so as to drive the operational amplifying circuit 106.

Note that the transistors 110 and 112 are symmetrical; according to different variations in the voltage input signal, one of the transistors 110 and 112 is switched on, and the other is switched off. Therefore, the clamp circuit 160 may also be configured on the conduction path of the transistor 110 or the conduction path of the transistor 112.

Figure 9:
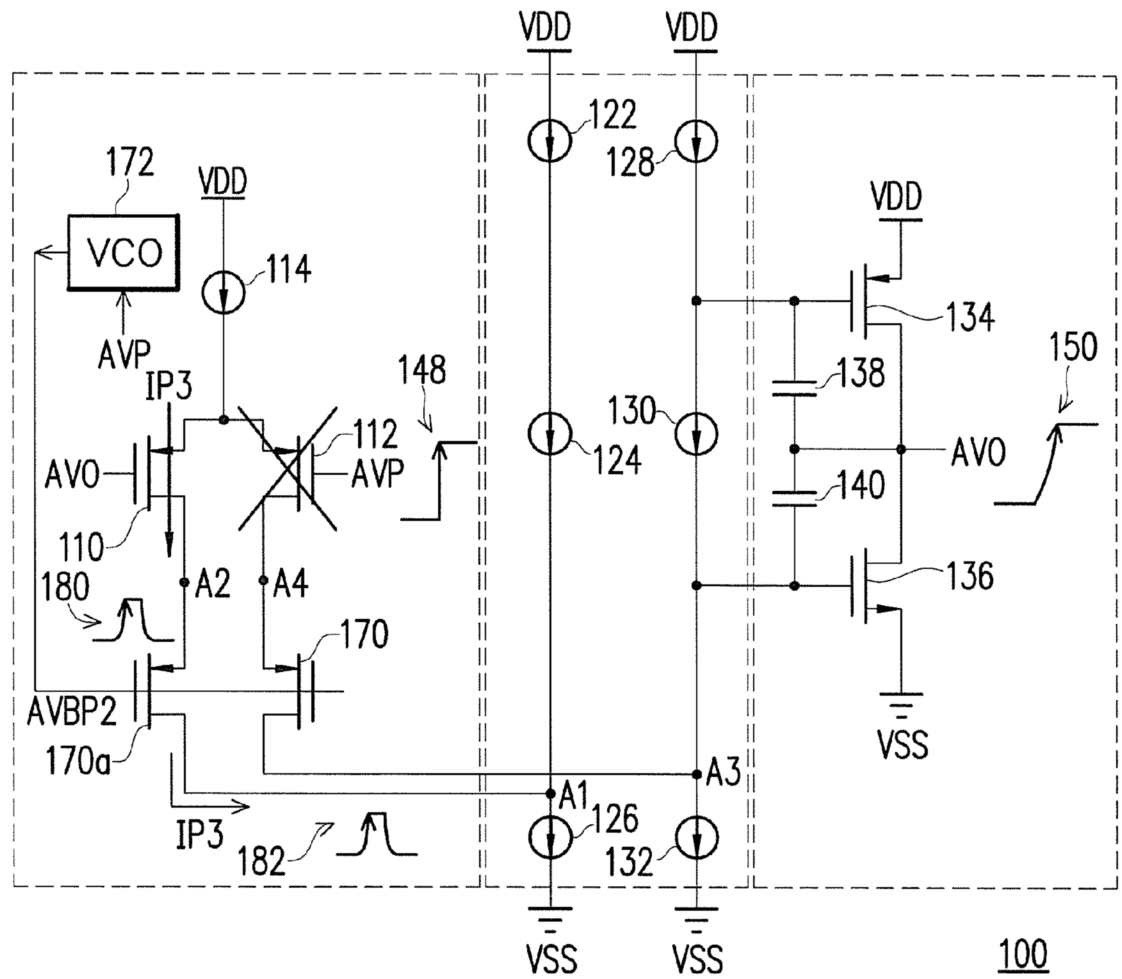
FIG. 9 is a schematic diagram illustrating a circuit of an operational amplifier according to an exemplary embodiment of the disclosure, and the circuit of the operational amplifier has a clamp circuit.

FIG. 9 is a schematic diagram illustrating a circuit of an operational amplifier according to an exemplary embodiment of the disclosure, and the circuit of the operational amplifier has a clamp circuit. With reference to FIG. 8 and the following FIG. 9, the clamp circuit may be simultaneously connected to the transistors 110 and 112, for instance. In the present exemplary embodiment, a transistor 170*a* may be additionally connected between the transistor 110 and the current source 126, i.e., the nodes A1 and A2 depicted in FIG. 9. Both the transistors 170*a* and 170 are controlled by the VCO circuit 172. When the voltage of the voltage input signal 148 is changed to have the high voltage level from the low voltage level in a transient manner, the transistor 112 is switched off, the transistor 110 is switched on, and the operational mechanism of the clamp circuits stays the same. Namely, the operational mechanisms of the signal 180 at the node A2 and the signal 182 at the node A1 are the same as those of the signal 176 at the node A4 and the signal 178 at the node A3 shown in FIG. 8.

Figure 10:
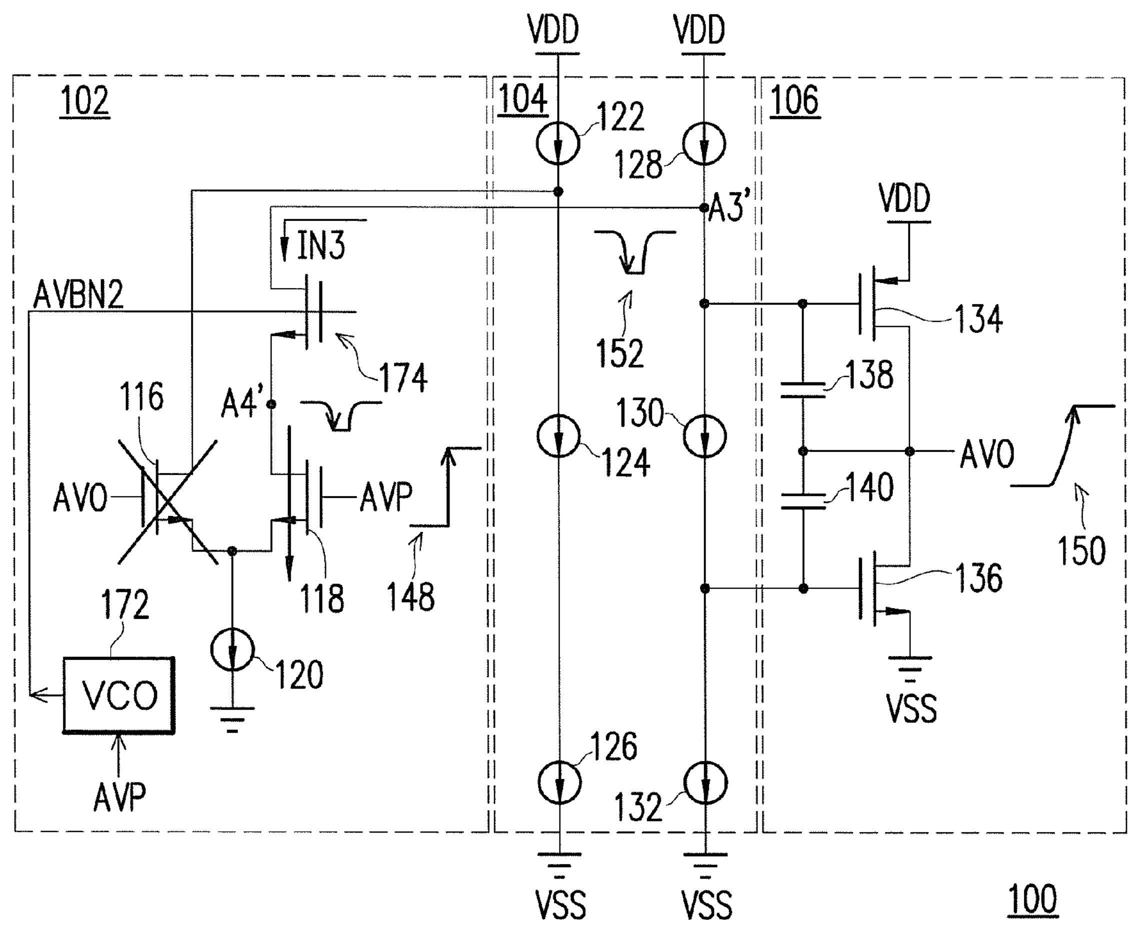
FIG. 10 is a schematic diagram illustrating a circuit of an operational amplifier according to an exemplary embodiment of the disclosure, and the circuit of the operational amplifier has a clamp circuit.

FIG. 10 is a schematic diagram illustrating a circuit of an operational amplifier according to an exemplary embodiment of the disclosure, and the circuit of the operational amplifier has a clamp circuit. The circuit shown in FIG. 10 corresponds to the circuit depicted in FIG. 5, and the clamp circuit 164 herein includes an MOS transistor 174 and a VCO circuit 172. The gate of the MOS transistor 174 is controlled by the control voltage AVBN2 output from the VCO circuit 172, and the VCO circuit 172 receives the voltage input signal AVP to output the control voltage AVBN2.

The MOS transistor 174 is connected between the transistor 118 and the current source 128. The node A4' is the connection point between the transistor 118 and the transistor 174, and the node A3' is the connection point between the transistor 174 and the current source 128. The signal that is located at the node A3' and generated by the current IN3 from the current source 128 may become a signal at the node A4' due to reducing voltage by the transistor 174, and the voltage variation range of the signal 162 at the node A4' is reduced. Therefore, in consideration of the relative voltage variations, neither the current source 128 nor the transistor 118 requires the device having a relatively high crossing-voltage endurance level.

Note that the transistors 116 and 118 are symmetrical; according to different variations in the voltage input signal, one of the transistors 116 and 118 is switched on, and the other is switched off. Therefore, the clamp circuit 164 may also be configured on the conduction path of the transistor 116 or the conduction path of the transistor 118.

Figure 11:
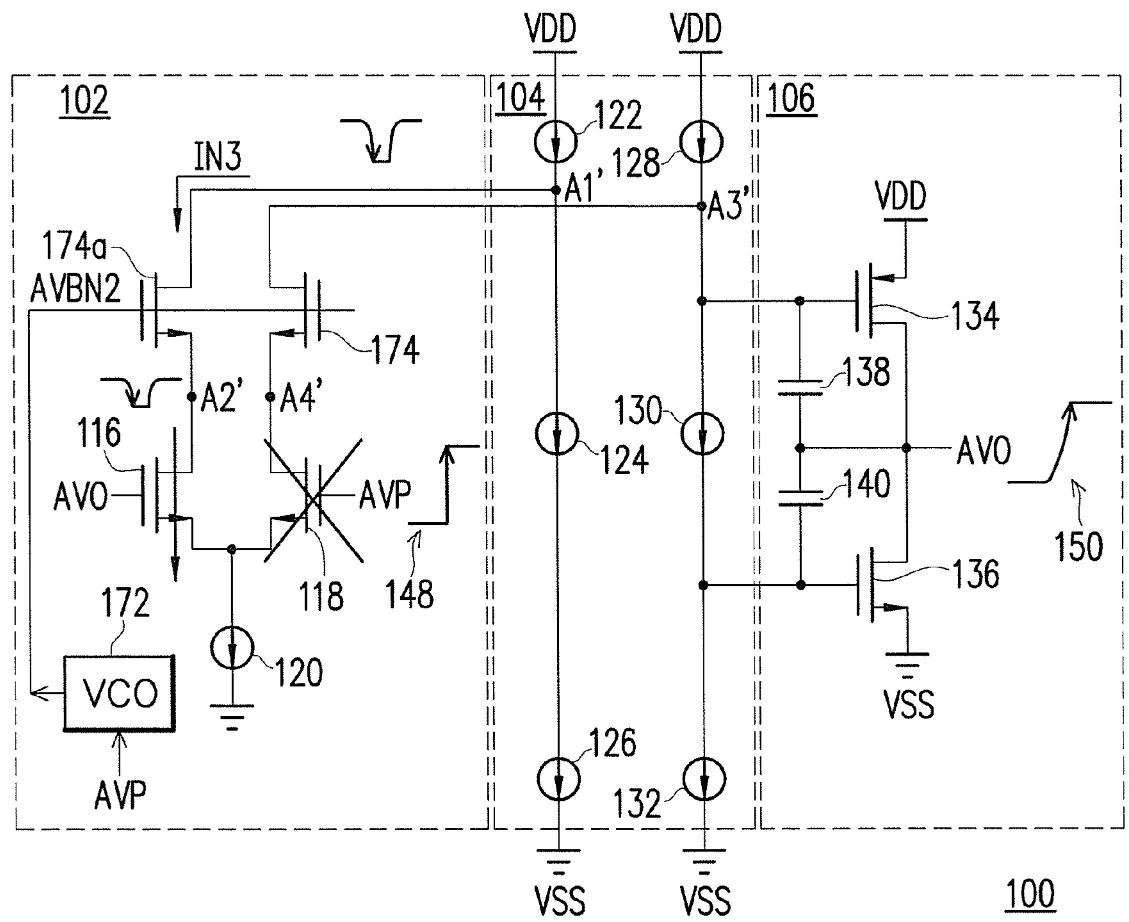
FIG. 11 is a schematic diagram illustrating a circuit of an operational amplifier according to an exemplary embodiment of the disclosure, and the circuit of the operational amplifier has a clamp circuit.

FIG. 11 is a schematic diagram illustrating a circuit of an operational amplifier according to an exemplary embodiment of the disclosure, and the circuit of the operational amplifier has a clamp circuit. With reference to FIG. 10 and the following FIG. 11, the clamp circuit may be simultaneously connected to the transistors 116 and 118, for instance. In the present exemplary embodiment, a transistor 174*a* may be additionally connected between the transistor 116 and the current source 122. Both the transistors 174*a* and 174 are controlled by the VCO circuit 172. When the voltage of the voltage input signal is changed to have the high voltage level from the low voltage level in a transient manner, the transistor 118 is switched off, the transistor 116 is switched on, and the operational mechanism of the clamp circuits stays the same. Namely, the operational mechanisms of the signal at the node A1' and the signal at the node A2' are the same as those of the signal at the node A3' and the signal at the node A4' shown in FIG. 10.

The clamp circuit in the circuit of the operational amplifier described herein does not require the device having the high crossing-voltage endurance level. The number and the location of the clamp circuit are not restricted herein. The above embodiments are merely exemplary but not exhaustive. Besides, combinations or modifications can be properly made to the exemplary embodiments without departing from the spirit and scope of the invention.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A circuit of an operational amplifier, comprising:
- an operational main circuit;
- a plurality of current sources configured to connect the operational main circuit to a high voltage source or a ground voltage source; and
- at least one clamp circuit connected between the operational main circuit and at least one of the current sources,
- wherein a transistor device connected to the at least one clamp circuit has a bias endurance level, and the bias endurance level of the transistor device is lower than a preset bias endurance level of the operational main circuit.

2. The circuit of the operational amplifier as recited in claim 1, wherein the operational main circuit comprises:
- a voltage-to-current circuit having a first input terminal and a second input terminal, the first input terminal receiving an external input of a voltage input signal, the second input terminal receiving a feedback signal;
- a current operational circuit connected to the voltage-to-current circuit; and
- an operational amplifying circuit connected to the voltage-to-current circuit, the operational amplifying circuit outputting a voltage output signal, the voltage output signal being the feedback signal.

3. The circuit of the operational amplifier as recited in claim 2, wherein the voltage-to-current circuit comprises:
- a first p-type transistor having a first gate, a first source, and a first drain, wherein the first gate is the first input terminal, the first source is connected to a first terminal of a first current source of the current sources, and a second terminal of the first current source is connected to the high voltage source; and
- a second p-type transistor having a second gate, a second source, and a second drain, wherein the second gate is the second input terminal, the second source is connected to the first source and the first terminal of the first current source, and the at least one clamp circuit is connected to one of or both of the first drain and the second drain.

4. The circuit of the operational amplifier as recited in claim 3, wherein the at least one clamp circuit is a p-type transistor, and a gate of the p-type transistor is controlled by a control voltage.

5. The circuit of the operational amplifier as recited in claim 4, wherein the at least one clamp circuit further comprises a voltage control circuit receiving the voltage input signal, so as to output the control voltage to control the at least one clamp circuit.

6. The circuit of the operational amplifier as recited in claim 3, wherein the first drain and the second drain are respectively connected to a second current source and a third current source of the current sources, and the second current source and the third current source are further connected to the ground voltage source.

7. The circuit of the operational amplifier as recited in claim 3, wherein the at least one clamp circuit comprises a first terminal and a second terminal, the first terminal is connected to one of or both of the first drain and the second drain, the second terminal is connected to one of the current sources, and a terminal of the operational amplifying circuit is connected to the first terminal or the second terminal of the at least one clamp circuit.

8. The circuit of the operational amplifier as recited in claim 2, wherein the voltage-to-current circuit comprises:

a first n-type transistor having a first gate, a first source, and a first drain, wherein the first gate is the first input terminal, the first source is connected to a first terminal of a first current source of the current sources, and a second terminal of the first current source is connected to the ground voltage source; and a second n-type transistor having a second gate, a second source, and a second drain, wherein the second gate is the second input terminal, the second source is connected to the first source and the first terminal of the first current source, wherein the at least one clamp circuit is connected to one of or both of the first drain and the second drain.

9. The circuit of the operational amplifier as recited in claim 8, wherein the at least one clamp circuit is an n-type transistor, and a gate of the n-type transistor is controlled by a control voltage.

10. The circuit of the operational amplifier as recited in claim 9, wherein the at least one clamp circuit further comprises a voltage control circuit receiving the voltage input signal, so as to output the control voltage to control the at least one clamp circuit.

11. The circuit of the operational amplifier as recited in claim 8, wherein the first drain and the second drain are respectively connected to a second current source and a third current source of the current sources, and the second current source and the third current source are further connected to the high voltage source.

12. The circuit of the operational amplifier as recited in claim 8, wherein the at least one clamp circuit comprises a first terminal and a second terminal, the first terminal is connected to one of or both of the first drain and the second drain, the second terminal is connected to one of the current sources, and a terminal of the operational amplifying circuit is connected to the first terminal or the second terminal of the at least one clamp circuit.

* * * * *